United States Patent
Perzlmaier

(10) Patent No.: US 10,665,757 B2
(45) Date of Patent: May 26, 2020

(54) COMPONENT FOR DISPLAYING A PICTOGRAM AND METHOD OF PRODUCING A COMPONENT

(71) Applicant: OSRAM OLED GmbH, Regensburg (DE)

(72) Inventor: Korbinian Perzlmaier, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/331,558

(22) PCT Filed: Aug. 28, 2017

(86) PCT No.: PCT/EP2017/071546
§ 371 (c)(1),
(2) Date: Mar. 8, 2019

(87) PCT Pub. No.: WO2018/046331
PCT Pub. Date: Mar. 15, 2018

(65) Prior Publication Data
US 2019/0198717 A1    Jun. 27, 2019

(30) Foreign Application Priority Data

Sep. 9, 2016    (DE) .......................... 10 2016 116 986

(51) Int. Cl.
*H01L 33/46* (2010.01)
*G09F 13/22* (2006.01)
(Continued)

(52) U.S. Cl.
CPC .............. *H01L 33/46* (2013.01); *G09F 13/22* (2013.01); *H01L 33/20* (2013.01); *H01L 33/22* (2013.01);
(Continued)

(58) Field of Classification Search
CPC ......... H01L 33/46; H01L 33/20; H01L 33/22; H01L 33/382; H01L 33/44; H01L 33/58; H01L 33/62
See application file for complete search history.

(56) References Cited

U.S. PATENT DOCUMENTS

| 4,144,635 A | 3/1979 | Teshima et al. |
| 2011/0012140 A1 | 1/2011 | Grabowski |

(Continued)

FOREIGN PATENT DOCUMENTS

| DE | 27 16 205 A1 | 11/1977 |
| DE | 10 2009 022 348 A1 | 11/2010 |

(Continued)

*Primary Examiner* — Anthony Ho
(74) *Attorney, Agent, or Firm* — DLA Piper LLP (US)

(57) ABSTRACT

A component includes a carrier, a semiconductor body and a mirror layer located therebetween, wherein the semiconductor body includes an active layer configured to generate light during operation of the component, the component has a main surface that illuminates during operation, wherein luminous areas of the main surface represent visually detectable information as a pictogram, in a plan view of the main surface, the pictogram has a contour at least partially defined by a contour of the mirror layer, and in a plan view of the main surface, the component has an outline different from the contour of the pictogram.

18 Claims, 4 Drawing Sheets

(51) Int. Cl.
*H01L 33/20* (2010.01)
*H01L 33/22* (2010.01)
*H01L 33/38* (2010.01)
*H01L 33/44* (2010.01)
*H01L 33/58* (2010.01)
*H01L 33/62* (2010.01)
*G09F 13/04* (2006.01)
*H01L 33/24* (2010.01)

(52) U.S. Cl.
CPC ............ *H01L 33/382* (2013.01); *H01L 33/44* (2013.01); *H01L 33/58* (2013.01); *H01L 33/62* (2013.01); *G09F 2013/0459* (2013.01); *G09F 2013/222* (2013.01); *H01L 33/24* (2013.01); *H01L 33/38* (2013.01); *H01L 2933/0016* (2013.01); *H01L 2933/0025* (2013.01)

(56) References Cited

U.S. PATENT DOCUMENTS

2013/0258298 A1   10/2013  Hing-wai
2017/0092808 A1    3/2017  Perzlmaier et al.

FOREIGN PATENT DOCUMENTS

DE    10 2014 108 300 A1   12/2015
WO       2011/029998 A1    3/2011

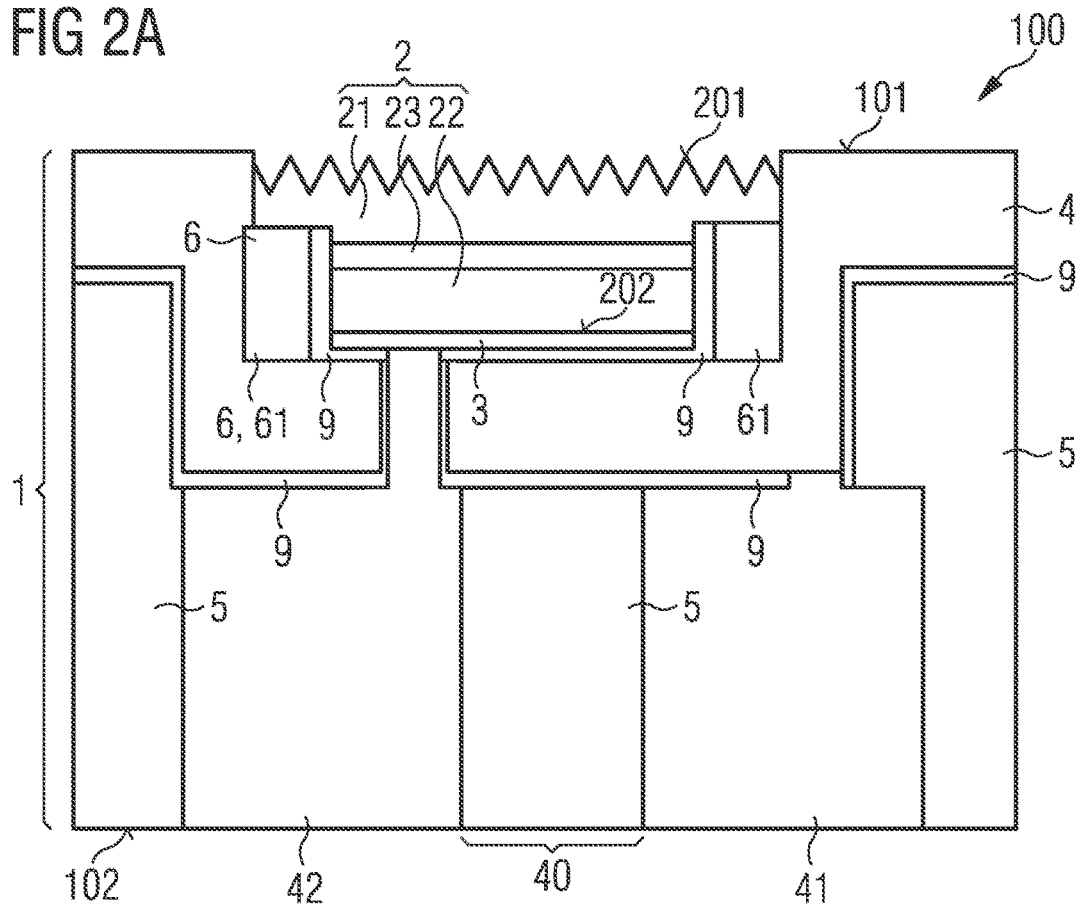
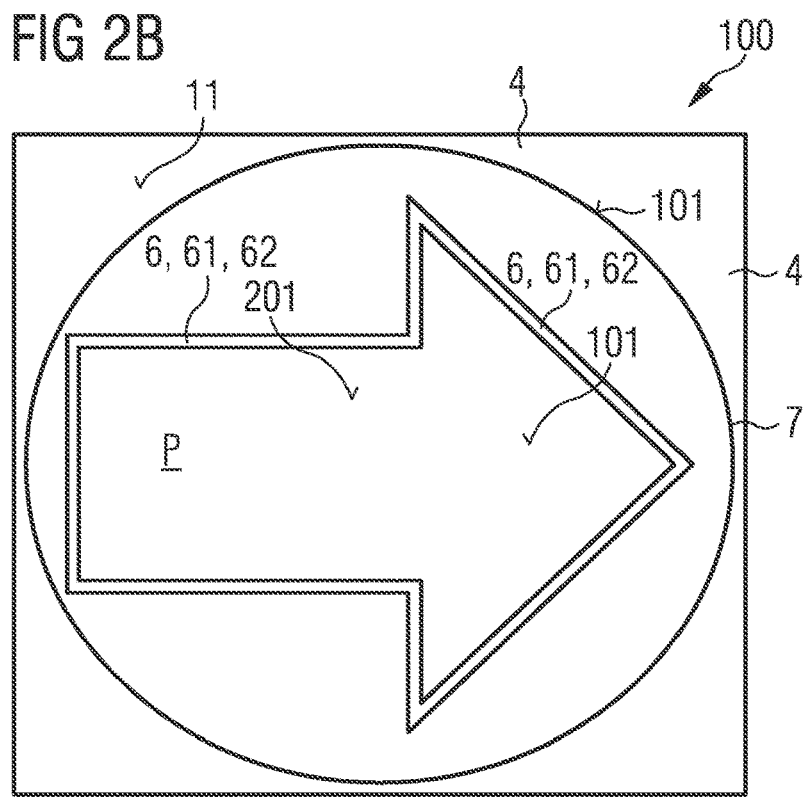

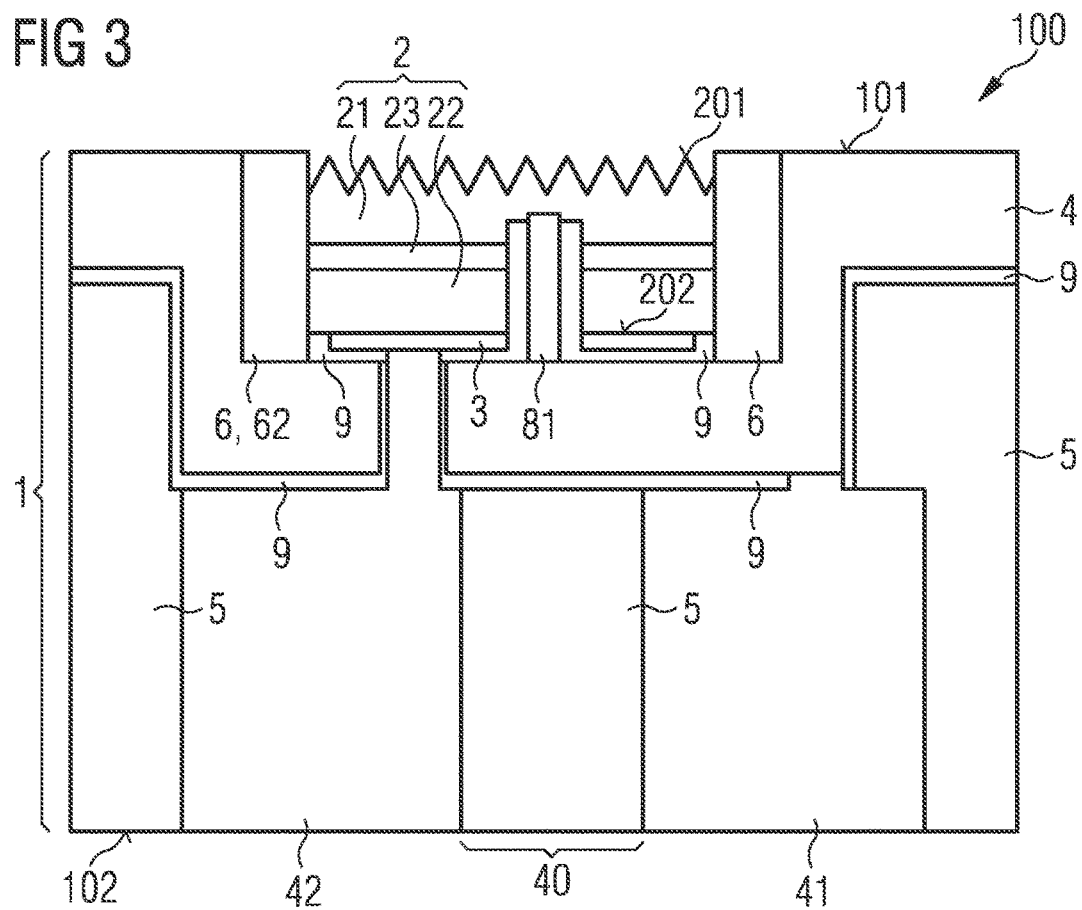
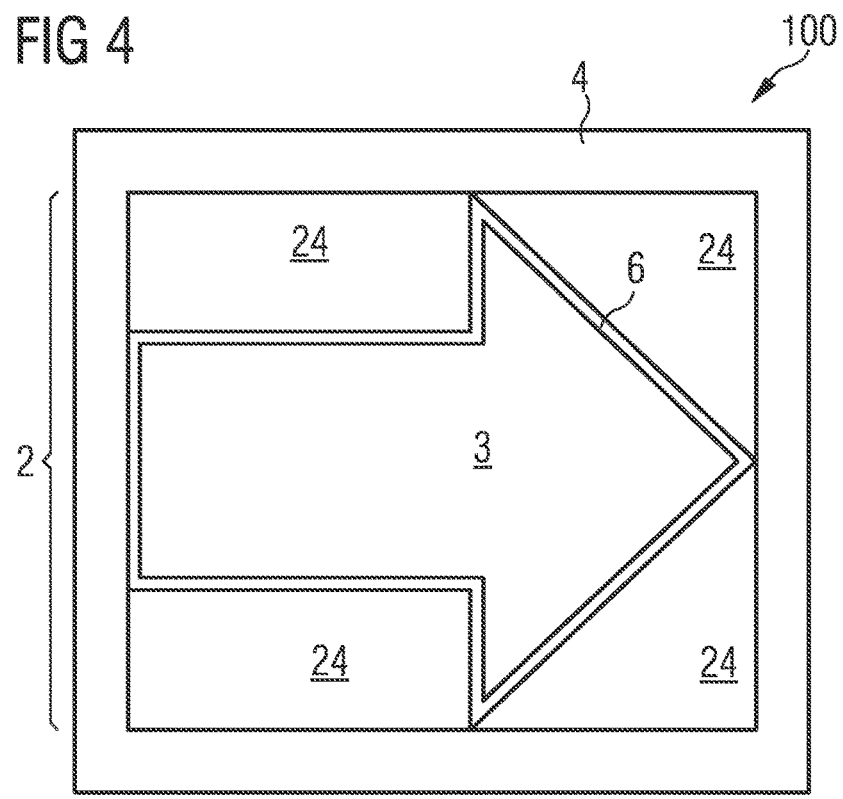

COMPONENT FOR DISPLAYING A PICTOGRAM AND METHOD OF PRODUCING A COMPONENT

TECHNICAL FIELD

This disclosure relates to a component, in particular an optoelectronic semiconductor chip, for displaying a pictogram and a method of producing a component.

BACKGROUND

To display a pictogram, a conventional unstructured light source is usually used to generate light using a mask and optics that is projected into a pictogram.

There is nonetheless a need to provide a component having a particularly compact design to display a pictogram, wherein in particular a mask forming the pictogram is dispensed with as well as a simplified and efficient method of producing a component.

SUMMARY

I provide a component including a carrier, a semiconductor body and a mirror layer located therebetween, wherein the semiconductor body includes an active layer configured to generate light during operation of the component, the component has a main surface that illuminates during operation, wherein luminous areas of the main surface represent visually detectable information as a pictogram, in a plan view of the main surface, the pictogram has a contour at least partially defined by a contour of the mirror layer, and in a plan view of the main surface, the component has an outline different from the contour of the pictogram.

I also provide a method of producing the component or a plurality of the components including a carrier, a semiconductor body and a mirror layer located therebetween, wherein the semiconductor body includes an active layer configured to generate light during operation of the component, the component has a main surface that illuminates during operation, wherein luminous areas of the main surface represent visually detectable information as a pictogram, in a plan view of the main surface, the pictogram has a contour at least partially defined by a contour of the mirror layer, and in a plan view of the main surface, the component has an outline different from the contour of the pictogram, wherein at a wafer level, the semiconductor body is structured such that the mirror layer and the semiconductor body have the same outer contours that define the contour of the pictogram to be displayed.

BRIEF DESCRIPTION OF THE DRAWINGS

FIGS. 2A, 2B, 3 and 4 show further examples of a component, each in schematic sectional view or top view.

LIST OF REFERENCE SIGNS

Figure 1A:
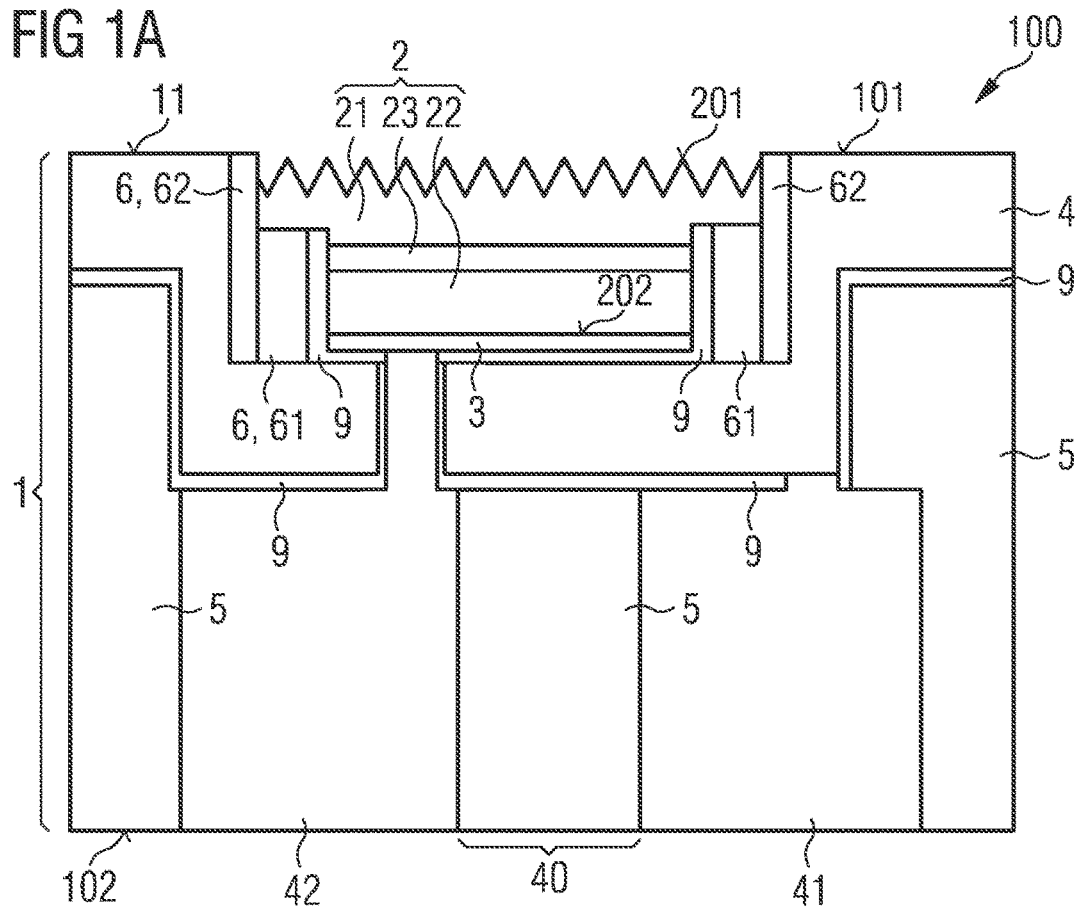
FIGS. 1A and 1B show schematic illustrations of a component according to a first example in sectional view and in top view, respectively.

100 Component
101 First main surface/Front side of component
102 Second main surface/Rear side of the component
1 Carrier
11 Surface of the carrier
2 Semiconductor body
21 First semiconductor layer
22 Second semiconductor layer
23 Active layer
24 Regions not covered by the mirror layer
201 First interface of the semiconductor body
202 Second interface of the semiconductor body
3 Mirror layer
4 Carrier layer
40 Intermediate region
41 First through-contact
42 Second through-contact
5 Shaped body
6 Frame-like structure
61 Contact structure of the frame-like structure
62 Electrically insulating frame-like layer
7 Optical element
81 Through-via
9 Insulating structure
P Pictogram

DETAILED DESCRIPTION

My component may have a carrier, a semiconductor body and a mirror layer located therebetween. The semiconductor body has an active layer configured to generate light, especially in the visible spectral range, when the component is in operation. During operation of the component, the component has a main surface that illuminates, wherein luminous areas of the main surface represent visually detectable information in the form of a pictogram. In a plan view of the main surface, the pictogram has a contour at least partially defined by a contour of the mirror layer. In a plan view of the main surface, the component has an outline that differs from the contour of the pictogram.

In particular, the outline of the component and an outer contour of the pictogram have different geometric forms. The main surface of the component is formed as a radiation passage surface, in particular as a radiation exit surface of the component. The main surface of the component can have a surface of the semiconductor body and/or a surface of the carrier of the component. During operation of the component, the main surface illuminates at least in places, wherein luminous areas of the main surface preferably define the shape of the pictogram. In a plan view, the geometrical shape, especially the outer contour of the luminous areas of the main surface is determined preferably by the shape of the active layer of the semiconductor body. The outer contour of the active layer and the outer contour of the luminous areas of the main surface can essentially be congruent. In particular, the component is an optoelectronic semiconductor chip, for example, in the form of a light-emitting diode (LED), wherein the carrier of the component in this example is a chip carrier, in particular the only chip carrier of the semiconductor chip. The mirror layer can be directly adjacent to the semiconductor body and/or to the carrier. The mirror layer is in particular a p-mirror layer. In other words, the mirror layer is arranged on the p-side so that at least one p-conducting semiconductor layer is arranged between an n-conducting semiconductor layer and the mirror layer.

Since the mirror layer, on one hand, at least partially determines or defines the contour of the pictogram and on the other hand, is arranged vertically between the semiconductor body and the carrier and thus integrated in the interior of the component, the component for displaying a predetermined pictogram can be made particularly compact. The mirror layer is formed in particular with regard to its materials such that the light emitted from the active layer incident on it is reflected back in the direction of the main surface. Preferably, regarding the choice of material, the mirror layer is formed such that it has a reflectance of at least 60%, for instance 70%, 80%, 90% or at least 95%. For example, the mirror layer is made of silver.

A vertical direction is generally understood to be a direction perpendicular to a main extension surface of the component or of the semiconductor body. A lateral direction is generally understood to be a direction that runs in particular parallel to the main extension surface of the component or of the semiconductor body. The vertical direction is for instance a growth direction of the semiconductor body. The vertical direction and the lateral direction are especially perpendicular to each other.

In a plan view of the main surface, the mirror layer and the pictogram may have outer contours of the same kind. This means that up to production tolerances, the mirror layer and the pictogram or the luminous areas on the main surface may have outer contours of identical geometric shapes. In a plan view of the main surface, the semiconductor body and the pictogram may have the same or different outer contours. In a plan view of the main surface, the semiconductor body, in particular the first semiconductor layer of the semiconductor body, and the mirror layer may have geometrically different shapes and/or external contours. Alternatively, in a plan view of the main surface, it is also possible for the semiconductor body, in particular the active layer of the semiconductor body, the pictogram and/or for the mirror layer to have outer contours of the same kind. If the semiconductor body, for example, the active layer of the semiconductor body and the pictogram have outer contours of the same kind when viewed onto the main surface, the semiconductor body itself is structured and adapted for instance to the geometric shape of the pictogram to be displayed. In this example, the contour of the pictogram is essentially determined by the outer contour of the semiconductor body. Preferably, in a plan view, the semiconductor body and the mirror layer have outer contours essentially of the same kind, which during operation of the component, determine the outer contour of the pictogram.

The component may have a frame-like structure that, in a plan view of the main surface, laterally encloses the mirror layer and/or the pictogram to be displayed at least in places. Preferably, the frame-like structure comprises a radiation-absorbing material at least in places and is therefore preferably formed to be radiation-absorptive. This makes it possible to achieve a particularly high contrast between illuminated and non-illuminated areas of the main surface. In particular, the frame-like structure delimits the semiconductor body in lateral directions. It is possible that in a plan view, the semiconductor body partially covers the frame-like structure or parts of the frame-like structure. A frame-like structure is generally understood to be a structure formed as a closed or open frame that at least encloses the active layer or the semiconductor body in lateral directions.

The frame-like structure may be at least partially formed as a contact structure for electrically contacting a first semiconductor layer of the semiconductor body. In the vertical direction, the active layer is arranged for instance between the first semiconductor layer and the mirror layer. The semiconductor body can have a second semiconductor layer, wherein the first and second semiconductor layers can be n-conductive and p-conductive, respectively, or vice versa. In particular, the active layer is a transition zone between the first and the second semiconductor layers in which electromagnetic radiation is generated during operation of the component. The active layer and/or the semiconductor layers can each be formed as a single layer or as a plurality of layers.

The contact structure of the frame-like structure may be formed such that the contact structure extends vertically from the carrier to the first semiconductor layer. The contact structure may be formed as a closed frame enclosing the active layer and the second semiconductor layer in lateral directions. It is also possible for the contact structure to be formed as an open frame or have a plurality of laterally spaced subregions arranged around the second semiconductor layer or around the active layer. The contact structure is for instance in direct electrical contact with the first semiconductor layer. For instance by an insulating structure, the contact structure is electrically insulated from the mirror layer which, for example, is formed to electrically contact the second semiconductor layer. The contact structure can be formed such that it extends throughout the second semiconductor layer and the active layer into the first semiconductor layer or is arranged laterally from the active layer, the second semiconductor layer and the mirror layer. In a plan view, the first semiconductor layer can partially or completely cover the contact structure.

The frame-like structure may at least be partially formed from a radiation-absorbing material. Preferably, the frame-like structure comprises a material having a reflectance of at most 60%, in particular at most 50%, 30% or at most 20%. This results in an increased contrast between the luminous and non-luminous areas of the main surface of the component. The pictogram represented by the luminous areas of the main surface can thus be formed in a particularly sharp manner and correspondingly can be displayed sharply.

The component may have a through-via extending throughout the mirror layer and the active layer to electrically contact the first semiconductor layer of the semiconductor body. The component may have a plurality of such through-vias. It is possible that, to electrically contact the first semiconductor layer, the component may have a through-via or a plurality of through-vias as well as a frame-like contact structure on the edge so that the homogeneity with respect to the current distribution in the first semiconductor layer as well as to the brightness of the component can be increased. In contrast to the edge-side contact structure arranged for instance laterally to the active layer, the through-via or the plurality of through-vias is/are completely enclosed by the semiconductor body in lateral directions.

In a plan view of the carrier, the semiconductor body may completely cover the mirror layer. The semiconductor body can have an outer contour that differs, especially geometrically differs from the outer contour of the mirror layer. This means that the semiconductor body and the mirror layer can have different geometric shapes when viewed from above. The semiconductor body can have a larger surface area than the mirror layer. Preferably, an electrically non-contactable material is arranged on regions, especially on the edge-regions of the semiconductor body not covered by the mirror layer. Such regions of the semiconductor body that have no overlaps with the mirror layer are therefore not directly electrically connected to the mirror layer.

Due to the comparatively poor transverse conductivity of the semiconductor body and the coverage of the electrically non-contactable material, electromagnetic radiation is generated mainly or exclusively in the regions of the active layer that in a plan view, have overlaps with the mirror layer. Thus, the contour of the pictogram is essentially defined by the geometric shape of the mirror layer, even if the mirror layer and the semiconductor body have different outer contours. The electrically non-contactable material can be an intrinsically electrically insulating material.

Alternatively, it is also possible for regions of a surface of the semiconductor body to be electrically inactivated in places, for example, by ion irradiation so that an electrically conductive layer such as a metal layer applied onto the electrically inactivated regions, cannot be sufficiently electrically connected to the semiconductor body. The shape of the pictogram can also be defined by targeted electrical inactivation of certain regions of the surfaces of the semiconductor body. In this example, although there may be a direct mechanical contact between the semiconductor body and the electrically conductive layer, the semiconductor body is not or only poorly electrically connected to the electrically conductive layer due to increased electrical resistance, especially in the electrically inactivated regions. The electrically conductive layer may contain a metal, in particular a highly radiation-absorbing metal. Such a metal is known under the name "additional metal". Compared to intrinsically electrically insulating material, such an additional metal can be applied onto the semiconductor body in a particularly simplified manner.

In a plan view of the semiconductor body, the mirror layer formed to electrically contact the second semiconductor layer, can be partially or completely surrounded in the lateral direction by the electrically non-contactable material. The electrically non-contactable material can be laterally directly adjacent to the mirror layer or laterally spaced apart from the mirror layer by an insulating structure and/or by the frame-like structure.

The carrier may have a metallic carrier layer, a first through-contact and a second through-contact. The first through-contact may be laterally spaced apart from the second through-contact for instance by an intermediate region. Preferably, in a plan view of the main surface, the intermediate region is laterally bridged by the metallic carrier layer. In a plan view, the metallic carrier layer can completely cover the first through-contact and/or the second through-contact.

The carrier may have an electrically insulating shaped body that laterally encloses, in particular completely encloses the first through-contact and/or the second through-contact. In the vertical direction, the through-contacts extend in particular throughout the shaped body. The intermediate region located between the through-contacts can be filled, in particular completely filled, by the shaped body or a material of the shaped body. The shaped body is in particular a molded body produced by a casting process. In particular, the semiconductor body may be encapsulated by a plastic such as a castable polymer such as a resin, epoxy or silicone. In particular, the semiconductor body is mechanically supported by the shaped body and the through-contacts. Due to bridging of the intermediate region by the metallic carrier layer, preferably formed as a mechanically self-supporting layer, the component remains free of mechanical weak points, especially in the intermediate region. The metallic carrier layer thus additionally stabilizes the component and contributes to an increase in the mechanical stability of the component. In lateral directions, the semiconductor body can be partially or completely surrounded by the metallic carrier layer.

The metallic carrier layer can electrically conductively connect to the edge contact structure and/or the through-via or the through-vias. In addition, the metallic carrier layer can electrically conductively connect to one of the through-vias and be electrically insulated from the other through-vias by an insulating structure. In particular, the metallic carrier layer can have an opening through which a through-contact, which in particular is electrically insulated from the metallic carrier layer, extends for instance as far as the mirror layer. The metallic carrier layer can be formed in a contiguous manner. Alternatively, it is possible for the metallic carrier layer to have laterally spaced subregions that each can electrically connect to one of the through-contacts. Alternatively, it is also possible for the metallic carrier layer to be formed such that it does not contribute to the electrical contacting of the semiconductor body and is thus electrically isolated from the edge contact structure, the through-contact and/or from the through-contacts.

The component may be formed as an optoelectronic radiation-emitting semiconductor chip. The component can have the carrier as the only carrier of the semiconductor chip. In this example, the only carrier of the semiconductor chip can be formed by the shaped body, the through-contacts and the metallic carrier layer, wherein up to a possible insulating structure the mirror layer adjoins both the carrier and the semiconductor body.

The pictogram may be a sign or a series of signs from a group consisting of letters, numbers, everyday symbols, figurative marks, company logos, warning signs, letter characters, traffic signs, prohibition signs and information signs. Possible designs of the pictogram may include short words such as "EXIT", symbols such as arrows, crosses and exclamation marks, gender symbols, non-smoking areas, emoticons or customer-specific designs such as figurative marks or company logos.

The component may have an optical element configured to project the pictogram. The optical element is thus intended to enlarge or image the pictogram defined by luminous areas of the main surface of the component. The optical element can be arranged on the semiconductor body. It is also possible for the optical element to be formed directly on the semiconductor body, for example, in a wafer composite using a molding process and thus to be integrated with the semiconductor body. The optical element can be a lens, a lens system, a mirror or a mirror system. In particular, the optical element is formed to enlarge the pictogram and/or to adjust the directions of projection. The component is preferably a semiconductor chip integrated with the optical element. Alternatively, it is also possible for the component to have a housing in which a semiconductor chip comprising the mirror layer, the carrier and semiconductor body is arranged, wherein the optical element, in particular an optical element manufactured separately from the semiconductor chip, is arranged on the semiconductor chip.

In my at least one method of producing a component, in particular a component described herein, or a plurality of components, the semiconductor body is structured at wafer level such that the mirror layer and the semiconductor body have outer contours of the same kind that define the contour of the pictogram to be displayed. At "wafer level" means that the semiconductor body is still located, in particular, in a semiconductor body composite, for instance in the wafer composite, wherein in a subsequent method step, the semiconductor body composite can be structured into a plurality of semiconductor bodies by forming a plurality of separation trenches. The shape of such separation trenches determines, for example, the shape or the contour of the semiconductor bodies to be produced. The separation trenches are usually formed prior to forming the shaped body, the through-contacts and/or the metallic carrier layer, in particular prior to the separation of a growth substrate. The metallic carrier layer and/or the shaped body can be partially formed in the region of the separation trenches and thus fill the separation trenches at least partially or completely.

Immediately after singulation of the common semiconductor body composite, for example, along the separation trenches into a plurality of components, each of the resulting components can have a semiconductor body described herein, a carrier described herein and a mirror layer described herein. In other words, the carrier is produced directly on the semiconductor body and is not produced for instance separately from the semiconductor body and mechanically connects to the semiconductor body. Pictograms having arbitrary contours can be produced in a simplified and efficient manner if, for example, lithography is defined by a laser process such as an LDI process (Laser Direct Imager), instead of using fixed masks to form the separation trenches. In the event that the mirror layer and the semiconductor body have outer contours of the same kind, the mirror layer can be formed such that its contour is of the same kind as that of the pictogram to be displayed so that a laser process can be carried out along the outer contour of the mirror layer to form the separation trenches in a simplified manner. The laser process can also be used to form or structure the elements defining the pictogram. Such elements are, for example, the mirror layer, the separation trenches or mesa trenches.

In the method of producing a component or a plurality of components, the mirror layer configured to electrically contact the semiconductor body of the component to be manufactured may be formed at wafer level such that the mirror layer has an outer contour defining the contour of the pictogram to be displayed, wherein the outer contour of the mirror layer differs from an outer contour of the semiconductor body.

In a plan view of the carrier, the semiconductor body can completely cover the mirror layer. An electrically not-contactable material is applied to regions, in particular to edge regions of the semiconductor body not covered by the mirror layer. Due to the comparatively low transverse conductivity of the semiconductor body, in particular of the second semiconductor layer, it can be guaranteed that only regions of the semiconductor body that in a plan view have overlaps with the mirror layer contribute to the generation of light during operation of the component. Alternatively or in addition, it is possible that a frame-like structure, at least partially electrically insulating and/or radiation-absorbing, is formed in the lateral direction between a region covered by the mirror layer and a region of the semiconductor body covered by the electrically non-contactable material. In the vertical direction, the frame-like structure can extend throughout the second semiconductor layer, the active layer and/or the first semiconductor layer.

To define the contour of the pictogram, a surface of the semiconductor body facing the carrier may be electrically inactivated in places, for example, by ion irradiation. The contour can be the inner and/or outer contour of the pictogram. This surface of the semiconductor body thus has electrically contactable and electrically non-contactable regions. An electrically conductive layer, for instance a metal layer, can be applied to the surface of the semiconductor body. Electrical contacts are thus formed on the electrically contactable regions. No electrical contacts or only electrical contacts having high electrical resistance are formed on the electrically not-contactable regions, accordingly. Due to the comparatively low transverse conductivity of the semiconductor body, electromagnetic radiation is generated in particular exclusively or mainly in regions of the active layer that, in a plan view, overlap the electrical contactable regions of the surface of the semiconductor body facing the carrier and thus define the shape of the pictogram.

The method above is particularly suitable for the production of one or a plurality of my components. The features described in connection with the component can therefore also be used for the method and vice versa.

Further advantages, preferred configurations and developments of the component and the method will become apparent from examples explained below in conjunction with the Figures.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

Figure 1B:
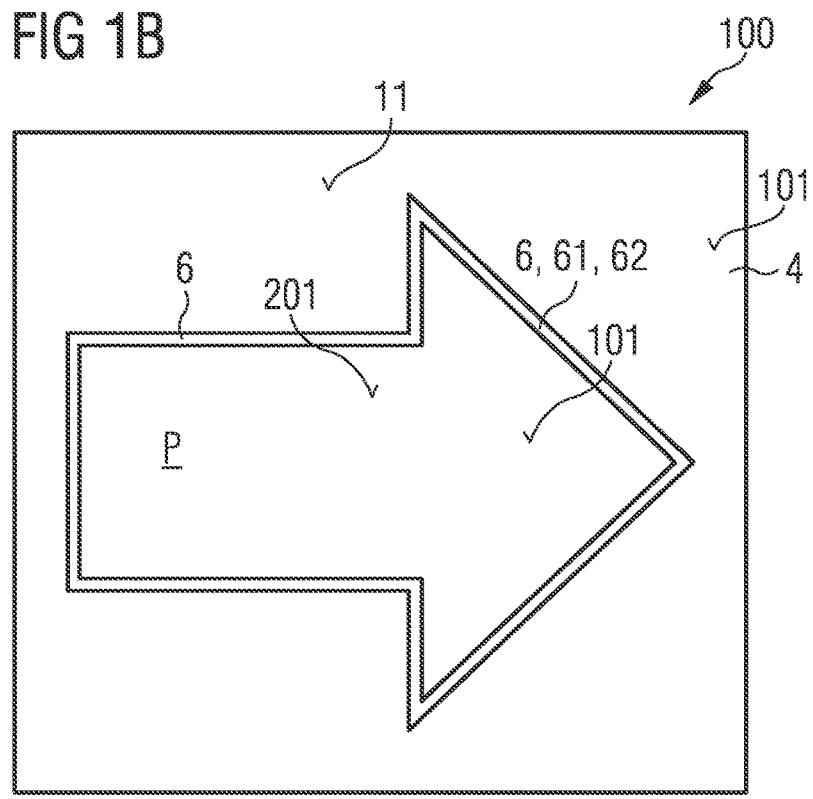
Figure 5A:
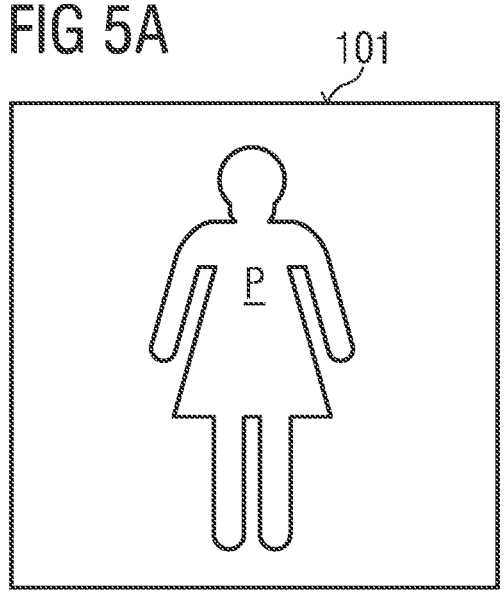
FIGS. 5A, 5B, 5C and 5D show examples of a pictogram.
Figure 5B:
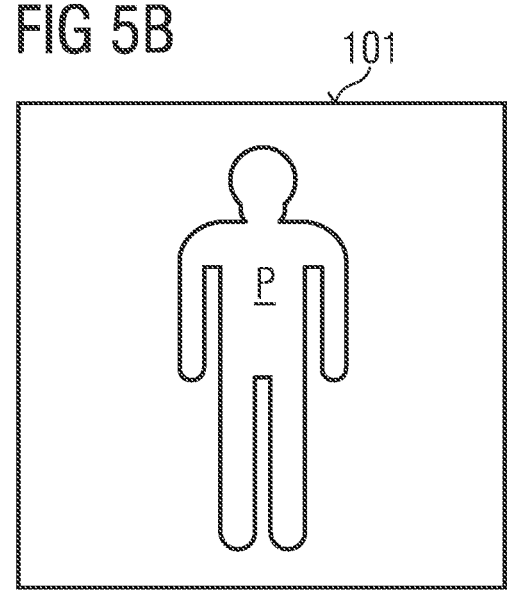
Figure 5C:
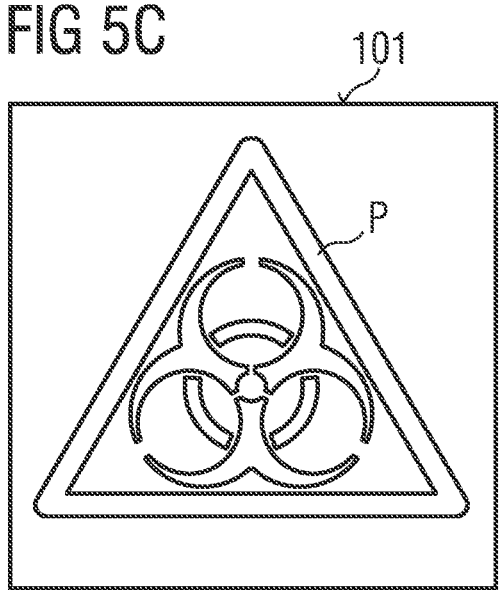
Figure 5D:
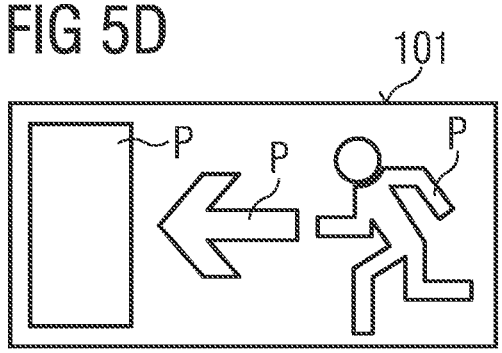

An example of the component 100 is shown in FIG. 1A in sectional view and in FIG. 1B in a plan view.

The component 100 has a carrier 1 and a semiconductor body 2 arranged on the carrier. In the vertical direction, a mirror layer 3 is arranged between the carrier and the semiconductor body 2.

In particular, the carrier 1 is different from a growth substrate. The carrier 1 has a carrier layer 4, a shaped body 5, a first through-contact 41 and a second through-contact 42. In the vertical direction, the through-contacts 41 and 42 extend throughout the shaped body 5. In lateral directions, the through-contacts 41 and 42 in particular are completely enclosed by the shaped body 5. The first through-contact 41 is laterally spaced from the second through-contact by an intermediate region 40. The intermediate region 40 is filled in particular by a material of the shaped body 5. Preferably, in a plan view, the intermediate region 40 is laterally covered, in particular completely covered by the metallic carrier layer 4. The carrier 1 has an insulating structure 9 that electrically insulates the metallic carrier layer from the mirror layer 3. In particular, the metallic layer 4 electrically connects to the first through-contact 41 and is electrically insulated from the second through-contact 42. The metallic carrier layer 4 has an opening through which the second through-contact 42 extends towards the mirror layer 3.

The component has a first front main surface 101 formed in particular as a radiation passage surface or as a radiation exit surface of the component. The main surface 101 is in particular a front side of the component. The component 100 can electrically connect externally via a second main surface 102, namely via the rear side 102 of the component, for example, via the through-contacts 41 and 42. In other words, the component 100 is formed as a surface-mountable component and can be externally electrically contactable via its rear side.

In a plan view, the front main surface 101 comprises a first interface 201 of the semiconductor body 2 and a surface 11 of carrier 1, in particular a surface 11 of the metallic carrier layer 4. The first interface 201 of the semiconductor body 2 delimits the semiconductor body 2 from the environment. In FIG. 1A, the first interface 201 of semiconductor body 2 is structured. Deviating from this, the first interface 201 can be unstructured. The semiconductor body 2 has a second interface 202 facing away from the first interface 201. In vertical directions, the semiconductor body 2, that in particular exclusively comprises semiconductor materials, is bounded by the interfaces 201 and 202. The first interface 201 is in particular the surface of a first semiconductor layer 21 of a first charge carrier type. The second interface 202 is in particular the surface of a second semiconductor layer 22 of a second charge carrier type.

The semiconductor body has an active layer 23 that generates electromagnetic radiation. The active layer 23 is arranged vertically between the first semiconductor layer 21 and the second semiconductor layer 22. The semiconductor body 2 can be based on a III-V semiconductor composite material such as InGaN. Alternatively, the semiconductor body 2 can be based on a II-VI semiconductor composite material. It is possible that the active layer 23 is configured to generate monochromatic light such as blue, green or red light. Alternatively, it is possible that the active layer 23 is configured to generate mixed light. The component 100 can be configured such that it emits monochromatic light, mixed light or white light during operation. The component 100 can have a converter layer comprising phosphors or be free of converter layers.

The component 100 has a frame-like structure 6 that in a plan view, partially or completely surrounds the semiconductor body 2 laterally. In particular, the frame-like structure 6 is formed from a radiation-absorbing material. For example, the frame-like structure 6 comprises a highly radiation-absorbing and electrically conductive material such as Ti, W, TiW, TiWN, Ta, Au or Pt or an electrically insulating material.

In FIG. 1A, the frame-like structure 6 has a contact structure 61 and an electrically insulating frame-like layer 62. In lateral directions, the electrically insulating frame-like layer 62 and/or the contact structure 61 can partially or completely enclose the semiconductor body 2. The contact structure 61 is configured for the electrical contacting of the first semiconductor layer 21. In the vertical direction, the contact structure 61 extends from the metallic carrier layer 4 to the first semiconductor layer 21. The contact structure 61 is arranged laterally from the active layer 23 and the second semiconductor layer 22. In FIG. 1A, the contact structure 61 electrically connects to the metallic carrier layer 4. In a plan view, the first semiconductor layer can partially or completely cover the contact structure 61. The contact structure 61 can be formed as a closed or open frame around the second semiconductor layer 22 and the active layer 23.

The carrier 1 has an insulating structure 9, wherein according to FIG. 1A, the insulating structure 9 electrically insulates the metallic carrier layer 4 from the active layer 23, the second semiconductor layer 22, the mirror layer 3 and the second through-contact 42. Via the contact structure 61, the metallic carrier layer 4 and the first through-contact 41, the first semiconductor layer 21 can be externally electrically connected. Due to the insulating structure 9, the contact structure 61 is electrically insulated from the second semiconductor layer 22 and the active layer 23 in lateral directions. According to FIG. 1A, the second semiconductor layer 22 is externally electrically connectable via the mirror layer 3 and the second through-contact 42.

Deviating from FIG. 1A, it is possible for the metallic carrier layer 4 to be electrically isolated from the through-contacts 41 and 42 so that in particular in this example the carrier layer 4 does not contribute to the electrical contacting of the semiconductor body 2. As a further alternative example of the metallic carrier layer 4, this can have subregions, wherein the subregions of the metallic carrier layer 4 are each configured for electrically contacting of one of the semiconductor layers 21 and 22. It is also possible that the metallic layer 4 is electrically isolated from the contact structure 61 and electrically connected to the mirror layer 3. In this example, the contact structure 61 can be formed such that it extends through the metallic layer 4 to one of the through-contacts 41 or 42. In this example, the metallic carrier layer 4 serves to electrically contact the second semiconductor layer 22, for example.

FIG. 1B shows the component 100 in a plan view. The first main surface 101 of the component has the first interface 201 of the semiconductor body 2 and a surface 11 of carrier 1, in particular a surface 11 of the metallic carrier layer 4. As shown in FIG. 1B, the semiconductor body 2 has a contour of a pictogram P in the form of an arrow in a plan view. In other words, in a plan view of the main surface 101, the semiconductor body 2 and the pictogram P to be displayed have outer contours of the same kind. The mirror layer 3 and the semiconductor body 2 as well as the pictogram P can also have outer contours of the same kind. When the component 100 is in operation, the main surface 101 illuminates especially only in the areas of the interface 201. The surface 11 does not illuminate when the component 100 is in operation, and in a plan view, is especially free of overlaps with the active layer 23 or with the semiconductor body 2. The shape and thus also the contour of the pictogram P are defined by all the luminous areas of the main surface 101. The pictogram P can thus be generated directly from the luminous areas of the main surface 101, i.e. without using an additional mask. In particular, the component 100 is free of a mask intended for the display or projection of a pictogram.

In FIG. 1B, the semiconductor body 2 is completely surrounded by the frame-like structure 6. The frame-like structure 6, in particular the electrically insulating layer 62, thus forms a frame, here in particular a closed frame around the semiconductor body 2. In lateral directions, the frame-like structure 6 thus delimits the semiconductor body 2 and/or the pictogram P from the non-luminous areas of the main surface 101 of the component. The non-luminous areas of the main surface 101 are formed in particular by surface 11 of the metallic carrier layer 4. In a plan view, the component 100 has an outline defined in particular by an outline of the metallic carrier layer 4 that differs from the contour of the pictogram P. In FIG. 1B, the component 100 has a square, particularly a rectangular outline, while the pictogram P has the contour of an arrow. The frame-like structure 6 thus delimits the luminous areas of the main surface 101 from the non-luminous areas of the main surface 101. In this example, the contour of the pictogram P is essentially defined by the geometric shape of the semiconductor body 2 and the contour, in particular of the outer contour of the mirror layer 3.

The example shown in FIG. 2A essentially corresponds to the example of a component 100 shown in FIG. 1A. In contrast, the frame-like structure 6 is free of the electrically insulating layer 62 arranged in the lateral direction between the contact structure 61 and the metallic carrier layer 4. The contact structure 61 can directly adjoin the metallic carrier layer 4 in the lateral direction. The contact structure 61 can be formed as a closed or open frame or have a number of laterally spaced subregions. The carrier layer 4 is preferably formed to be contiguous. In a plan view, the first semiconductor layer 21 at least partially or completely covers the frame-like structure 6 formed as a contact structure 61.

The example shown in FIG. 2B essentially corresponds to the example of a component shown in FIG. 1B. In contrast, the component 100 has an optical element 7 arranged on the semiconductor body 2 or integrated with the semiconductor body 2. The optical element 7 is in particular configured for the projection of the pictogram P. Since the luminous areas of the first main surface 101 already have the shape of the pictogram P to be displayed, the component 100 is in particular free of a mask for displaying the pictogram P that is arranged for instance between the semiconductor body 2 and the optical element 7. The component 100 intended to display a pictogram P can thus be made particularly compact. The optical element 7 can be prefabricated and applied to the semiconductor body 2. Alternatively, it is also possible for the optical element 7 to be integrated with the semiconductor body 2 or the metallic carrier layer 4 when the optical element 7 is applied directly onto the semiconductor body 2 or onto the metallic carrier layer 4 using a molding process, for example.

The example of a component shown in FIG. 3 essentially corresponds to the example shown in FIG. 1A. In contrast, the component 100 has one or a plurality of through-vias 81. The through-via 81 is configured to electrically contact the first semiconductor layer 21 and extends in the vertical direction from the metallic carrier layer 4 throughout the mirror layer 3, the second semiconductor layer 22 and the active layer 23 to the first semiconductor layer 21. In lateral directions, the through-via 81 is completely surrounded by the insulating structure 9 or the semiconductor body 2. Deviating from FIG. 3, it is also possible that the component 100 has a contact structure 61 in addition to the through-via 81 or through-vias 81 as shown in FIGS. 1A and 2A.

The example of a component shown in FIG. 4 essentially corresponds to the example shown in FIG. 1B. In contrast, the semiconductor body 2 and the mirror layer 3 have different outer contours in a plan view. While the semiconductor body 2, in particular the active layer 23 and/or the second semiconductor layer 22 of the semiconductor body 2, has/have the shape of a rectangle in a plan view, the mirror layer 3 has the shape of an arrow.

Preferably, the mirror layer 3 covers only regions of the semiconductor body 2 illuminated during operation of the component 100 and configured to display the pictogram P. Regions 24 of the semiconductor body 2 not to be illuminated during operation of the component 100 are in particular covered with a material that is electrically non-contactable. Due to the comparatively low transverse conductivity of the semiconductor body 2, electromagnetic radiation is generated only in such regions of the active layer 23 which in a plan view, have overlaps with the mirror layer 3. In this example, the component 100 preferably has a frame-like structure 6 at least partially electrically insulating and arranged between luminous areas and non-luminous areas of the semiconductor body 2. In a plan view, the frame-like structure 6 can thus delimit the regions 24 not covered by the mirror layer 3 from the regions of the semiconductor body 2 covered by the mirror layer 3 and are thus preferably electrically connected directly via the mirror layer 3.

It is also possible that the regions 24 of the semiconductor body 2 not covered by the mirror layer 3, are structured such that the regions 24 are free of the second semiconductor layer 22 and/or free of the active layer 23. The regions 24 can therefore only have subregions of the first semiconductor layer 21 and can serve as flat contact areas for the first semiconductor layer 21 by filling them with an electrically conductive material, for example. It is also possible that the regions 24 correspond to electrically inactivated regions of the second interface 202 of the semiconductor body 2.

FIGS. 5A to 5D show exemplary contours of the pictogram P on the main surface 101. Possible designs of pictograms P are symbols for gender (FIG. 5A and FIG. 5B), warning signs for biohazard (FIG. 5C), exit symbols (FIG. 5D) or other everyday symbols or customer-specific symbols not shown here.

By targeted forming a semiconductor body and/or a mirror layer of a surface-emitting component, for instance of a semiconductor chip or a light-emitting diode, an ordinary projection of pictograms can be made in a simplified way, since the light source itself is especially shaped so that no imaging mask is required for projection, but only an imaging optical system.

This application claims priority of DE 10 2016 116 986.2, the subject matter of which is incorporated herein by reference.

My components and methods are not restricted to the configurations/structures by the description made with reference to examples. This disclosure rather comprises any novel feature and any combination of features, including in particular any combination of features in the appended claims, even if the feature or combination is not itself explicitly indicated in the claims or examples.

The invention claimed is:

1. A component comprising a carrier, a semiconductor body and a mirror layer located therebetween, wherein
    the semiconductor body comprises an active layer configured to generate light during operation of the component,
    the component has a main surface that illuminates during operation, wherein luminous areas of the main surface represent visually detectable information as a pictogram,
    in a plan view of the main surface, the pictogram has a contour at least partially defined by a contour of the mirror layer, and
    in a plan view of the main surface, the component has an outline different from the contour of the pictogram.

2. The component according to claim 1, wherein, in a plan view of the main surface, the semiconductor body and the pictogram have the same outer contours.

3. The component according to claim 1, wherein, in a plan view of the main surface, the semiconductor body and the pictogram have different outer contours.

4. The component according to claim 1, wherein, in a plan view of the main surface, the mirror layer and the pictogram have the same outer contours.

5. The component according to claim 1, further comprising a frame structure that, in a plan view of the main surface, at least partially surrounds at least one of the mirror layer and the pictogram laterally.

6. The component according to claim 5, wherein the frame structure is formed at least in regions as a contact structure for electrically contacting a first semiconductor layer of the semiconductor body, and the active layer is arranged in the vertical direction between the first semiconductor layer and the mirror layer.

7. The component according to claim 6, wherein the semiconductor body comprises a second semiconductor layer, the active layer is arranged between the first semiconductor layer and the second semiconductor layer, and the contact structure extends vertically from the carrier to the first semiconductor layer.

8. The component according to claim 5, wherein the frame structure is formed at least partially from a radiation-absorbing material.

9. The component according to claim 1, further comprising a through-via extending throughout the mirror layer and the active layer to electrically contact a first semiconductor layer of the semiconductor body.

10. The component according to claim 1, wherein
    in a plan view of the carrier, the semiconductor body completely covers the mirror layer and has an outer contour different from the outer contour of the mirror layer, and an electrically non-contactable material is arranged at least on edge-side regions of the semiconductor body not covered by the mirror layer.

11. The component according to claim 1, wherein
the carrier has a metallic carrier layer, a first through-contact and a second through-contact,
the first through-contact is laterally spaced from the second through-contact by an intermediate region, and
in a plan view of the main surface, the metallic carrier layer laterally bridges the intermediate region.

12. The component according to claim 11, wherein the carrier has an electrically insulating shaped body laterally enclosing the first through-contact and the second through-contact and fills the intermediate region.

13. The component according to claim 1, formed as an optoelectronic radiation-emitting semiconductor chip, wherein the component has the carrier as the only carrier of the semiconductor chip.

14. The component according to claim 1, wherein the pictogram is a sign or a series of signs selected from the group consisting of letters, numbers, everyday symbols, figurative marks, company logos, warning signs, letter characters, traffic signs, prohibition signs and information signs.

15. The component according to claim 1, wherein an optical element is disposed on the semiconductor body, and the optical element is configured to project the pictogram.

16. A method of producing the component as claimed in claim 1 or a plurality of the components,
wherein at a wafer level, the semiconductor body is structured such that the mirror layer and the semiconductor body have the same outer contours that define the contour of the pictogram to be displayed.

17. A method of producing the component as claimed in claim 1 or a plurality of the components, wherein
the mirror layer is configured to electrically contact the semiconductor body of the component to be produced and at wafer level is formed such that the mirror layer has an outer contour defining the contour of the pictogram to be displayed,
in a plan view of the carrier, the semiconductor body completely covers the mirror layer and has an outer contour different from the outer contour of the mirror layer, and
an electrically non-contactable material is applied at least to edge-side regions of the semiconductor body not covered by the mirror layer.

18. A method of producing the component as claimed in claim 1 or a plurality of the components,
wherein a surface of the semiconductor body facing the carrier is electrically inactivated in regions to define the contour of the pictogram.

* * * * *